United States Patent
De Boet et al.

(10) Patent No.: US 10,685,927 B2
(45) Date of Patent: Jun. 16, 2020

(54) PACKAGED RF POWER AMPLIFIER HAVING A HIGH POWER DENSITY

(71) Applicant: Ampleon Netherlands B.V., Nijmegen (NL)

(72) Inventors: Johannes Adrianus Maria De Boet, Nijmegen (NL); Yi Zhu, Nijmegen (NL); Yuri Volokhine, Nijmegen (NL); Vittorio Cuoco, Nijmegen (NL); Albertus Gerardus Wilhelmus Philipus Van Zuijlen, Nijmegen (NL); Iordan Konstantlnov Sveshtarov, Nijmegen (NL); Josephus Henricus Bartholomeus Van der Zanden, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 16/327,689

(22) PCT Filed: Aug. 23, 2017

(86) PCT No.: PCT/NL2017/050550
§ 371 (c)(1),
(2) Date: Feb. 22, 2019

(87) PCT Pub. No.: WO2018/038606
PCT Pub. Date: Mar. 1, 2018

(65) Prior Publication Data
US 2019/0229077 A1    Jul. 25, 2019

(30) Foreign Application Priority Data

Aug. 23, 2016  (NL) ...................... 2017349

(51) Int. Cl.
*H03F 3/191*  (2006.01)
*H01L 23/66*  (2006.01)
(Continued)

(52) U.S. Cl.
CPC .............. *H01L 23/66* (2013.01); *H01L 24/48* (2013.01); *H01L 24/49* (2013.01); *H01L 25/18* (2013.01);
(Continued)

(58) Field of Classification Search
CPC ....................................................... H03F 3/191
(Continued)

(56) References Cited

U.S. PATENT DOCUMENTS 4,065,723 A * 12/1977 Endres .................... H03F 3/245
330/302
7,084,708 B2 * 8/2006 Sugiura ............. H01L 23/49838
257/E23.07

(Continued)

FOREIGN PATENT DOCUMENTS

EP    2388815 A1    11/2011

OTHER PUBLICATIONS

PCT International Search Report and Written Opinion, PCT Application No. PCT/NL2017/050550, dated Nov. 8, 2017, 15 pages.
(Continued)

*Primary Examiner* — Henry Choe
(74) *Attorney, Agent, or Firm* — McDonnell Boehnen Hulbert & Berghoff LLP

(57) ABSTRACT

A packaged RF power amplifier comprises an output network coupled to the output of a RF power transistor, which output network comprises a plurality of first bondwires extending along a first direction between the output of transistor and an output lead of the package, a series connection of a second inductor and a first capacitor
(Continued)

between the output of the RF power transistor and ground, and a series connection of a third inductor and a second capacitor connected in between ground and the junction between the second inductor and the first capacitor. The first and second capacitors are integrated on a single passive die and the third inductor comprises a first part and a second part connected in series, wherein the first part extends at least partially along the first direction, and wherein the second part extends at least partially in a direction opposite to the first direction.

10 Claims, 8 Drawing Sheets

(51) Int. Cl.
    *H03F 1/02*         (2006.01)
    *H03F 1/56*         (2006.01)
    *H03F 3/195*       (2006.01)
    *H01L 23/00*       (2006.01)
    *H01L 25/18*       (2006.01)
    *H01L 49/02*       (2006.01)

(52) U.S. Cl.
    CPC ........... *H01L 28/40* (2013.01); *H03F 1/0205* (2013.01); *H03F 1/0288* (2013.01); *H03F 1/565* (2013.01); *H03F 3/195* (2013.01); *H01L 2223/6611* (2013.01); *H01L 2223/6655* (2013.01); *H01L 2223/6661* (2013.01); *H01L 2223/6672* (2013.01); *H01L 2224/04042* (2013.01); *H01L 2224/49175* (2013.01); *H01L 2924/00014* (2013.01); *H01L 2924/1033* (2013.01); *H01L 2924/10253* (2013.01); *H01L 2924/13064* (2013.01); *H01L 2924/13091* (2013.01); *H01L 2924/19011* (2013.01); *H01L 2924/19041* (2013.01); *H01L 2924/19042* (2013.01); *H01L 2924/30111* (2013.01); *H03F 2200/216* (2013.01); *H03F 2200/222* (2013.01); *H03F 2200/225* (2013.01); *H03F 2200/267* (2013.01); *H03F 2200/297* (2013.01); *H03F 2200/301* (2013.01); *H03F 2200/306* (2013.01); *H03F 2200/309* (2013.01); *H03F 2200/387* (2013.01); *H03F 2200/391* (2013.01); *H03F 2200/402* (2013.01); *H03F 2200/451* (2013.01); *H03F 2200/75* (2013.01)

(58) Field of Classification Search
    USPC ......................................... 330/307, 302, 305
    See application file for complete search history.

(56) References Cited

U.S. PATENT DOCUMENTS

| | | | |
|---|---|---|---|
| 9,991,854 B1 * | 6/2018 | Zhu | ................. H03F 3/195 |
| 2007/0024358 A1 | 2/2007 | Perugupalli | |
| 2007/0024374 A1 | 2/2007 | Blair et al. | |
| 2008/0278241 A1 | 11/2008 | Harm | |
| 2015/0381121 A1 | 12/2015 | Jones et al. | |

OTHER PUBLICATIONS

PCT International Preliminary Report on Patentability, PCT Application No. PCT/NL2017/050550, dated Nov. 30, 2018, 14 pages.

* cited by examiner

PACKAGED RF POWER AMPLIFIER HAVING A HIGH POWER DENSITY

CROSS-REFERENCE TO RELATED APPLICATION

The present application is a national stage entry of International Patent Application No. PCT/NL2017/050550, filed Aug. 23, 2017, which claims priority to Netherlands Patent Application No. 2017349, filed Aug. 23, 2016, the contents of which are hereby incorporated by reference.

FIELD OF THE DISCLOSURE

The present invention is related to a packaged radiofrequency (RF) power amplifier. The invention further relates to a cellular base station for mobile telecommunications comprising a packaged RF power amplifier.

BACKGROUND

A known RF power amplifier is illustrated in FIG. 1. The corresponding equivalent circuit diagram is illustrated in FIG. 2. The known amplifier 1 comprises a package having an output lead 2, an input lead 3, and a flange 4. An active die 5, on which an RF power transistor 6 is arranged, is mounted on flange 4. An input of RF power transistor 6, such as a gate, is connected to a bondpad bar 7, and an output of RF power transistor 6, such as a drain, to a bondpad bar 8. Packaged RF power amplifier 1 further comprises a first passive die 9, a second passive die 10, and a third passive die 11. On each die, an integrated capacitor C1, C2, C4 is arranged that has two terminals of which one is grounded. Within the context of the present invention, a grounded terminal refers to a terminal that is electrically connected to flange 4. The other terminal is connected to a bondpad bar assembly comprising bondpad bars 12, 13, 14. Each of the dies 9, 10, 11 as well as the connecting bondwires are arranged inside the package.

Within the context of the present invention, an active die is a semiconductor die on which the RF power transistor is arranged, and a passive die is a die, preferably but not necessarily made from semiconductor material, on which one or more passive components are realized.

A first inductor L1 connects the output of RF power transistor 6 to output lead 2. This inductor comprises a plurality of first bondwires 19 that extend in a first direction between bondpad bar 8 and output lead 2. A second inductor L2 connects the output of RF power transistor 6 to the non-grounded terminal of first capacitor C1. This inductor comprises a plurality of second bondwires 17 that extend between bondpad bar 8 and bondpad bar 13. A third inductor L3 connects the first terminal of first capacitor C1 to the non-grounded terminal of the second capacitor C2. This inductor comprises one or more third bondwires 18 that extend between bondpad 13_1, which is electrically connected to bondpad bar 13, and bondpad bar 14.

A fifth inductor L5 connects input lead 3 to the non-grounded terminal of fourth capacitor C4. This inductor comprises a plurality of fifth bondwires 15 that extend between input lead 3 and bondpad bar 12, which bondpad bar is electrically connected to the non-grounded terminal of fourth capacitor C4. A sixth inductor L6 connects bondpad bar 12 to the input of RF power transistor 6. This inductor comprises a plurality of sixth bondwires 16. Inductors L5, L6 and capacitor C4 constitute an input impedance matching network.

As illustrated in FIG. 1, second capacitor C2 is located on passive die 11 next to active die 5, whereas the first and fourth capacitors C1, C4 are arranged in between active die 5 and output lead 2 or input lead 3, respectively.

Now referring to FIG. 2, a parasitic output capacitance is present at the output of RF power transistor 6. This capacitance, modeled by Cds, deteriorates the performance of RF power transistor 6 at the operational frequency, which typically lies in a range between 1 and 3 GHz, although other frequency ranges are not excluded.

FIG. 2 illustrates the known solution to overcome this problem. The output network formed by L2, L3, C1, and C2 is configured to resonate with Cds at or close to the operational frequency. More in particular, at or close to the operational frequency, the output network will act as a shunt inductor. This inductor will display a parallel resonance with Cds such that the impact of the latter on the RF performance at the operational frequency is mitigated. Typically, the shunt inductor is largely determined by L2.

C2 is much larger than C1. C2 will, at a relatively low frequency, display a parallel resonance with the inductance associated with the biasing network. This inductance is modelled by Lfeed in FIG. 2. It should be noted that the invention is not limited to the particular position at which the biasing currents are introduced in the circuit.

The parallel resonance of C2 and Lfeed will introduce a first peak in the effective impedance seen at the drain of the transistor. Another resonance occurs at a higher frequency substantially corresponding to the resonance frequency of C1 and L3. By properly choosing the component values for L2, L3, C1, and C3 a desired impedance behavior can be realized in the frequency range typically associated with second order intermodulation products. In this range, the impedance seen by RF power transistor 6 should be as low as possible to avoid performance degradation.

An important design parameter for packaged RF power amplifiers is the power that can be generated within a given package size. A higher power density, expressed in Watts per unit package area, enables a more compact design. A further important parameter is the efficiency with which the power is generated, such as the power added efficiency. A high efficiency indicates that little power is dissipated inside the package. This has positive consequences for the amount of cooling that is required for cooling the packaged RF power amplifier and for the overall power budget of the system.

A packaged radiofrequency (RF) power amplifier according to the preamble of claim 1 is known from EP2388815A1 $_{[DRG1]}$. This document describes an alternative implementation of the circuit in FIG. 1. Here, capacitor C2 is integrated on the active semiconductor die and capacitor C1 is integrated on a passive semiconductor die that is arranged inside the package in between the active die and the output lead. A further packaged radiofrequency (RF) power amplifier is known from US2007024358A1 $_{[DRG2]}$.

SUMMARY

An object of the present invention is to provide a higher power density than the known system of FIG. 1 without or with little efficiency degradation.

This object has been achieved with the packaged RF power amplifier according to claim 1 which is characterized in that the second capacitor is integrated on the passive semiconductor die that is arranged in between the output lead and the active die. The third inductor comprises a first part and a second part connected in series, wherein the first part extends at least partially along the first direction, and wherein the second part extends at least partially in a direction opposite to the first direction. Alternatively, the third inductor extends substantially perpendicular to the first direction.

The applicant has found that although the first and second capacitors are closely arranged due to their integration on a single passive die, sufficient efficiency of the amplifier can still be maintained due to the arrangement of the third inductor as described above. The skilled person in the art is normally very reluctant to arrange RF sensitive components, such as capacitors and inductors, at the output of the amplifier close together as he anticipates unwanted coupling effects. The applicant has overcome this prejudice by means of the particular arrangement of the third inductor. More in particular, the applicant has found that the arrangement of the third inductor limits the bleeding of RF signal to ground via the second capacitor caused by electromagnetic coupling with the first inductor.

The first part and the second part of the third inductor may each extend entirely on or above the passive semiconductor die. Alternatively, when the third inductor extends substantially perpendicular to the first direction, the third inductor may extend entirely on or above the passive semiconductor die. In both cases, the first capacitor may comprise a metal-insulator-metal capacitor and the second capacitor may comprise a deep trench capacitor.

The third inductor may comprise a plurality of third bondwires, wherein at least one of the third bondwires forms the first part and wherein the other third bondwire(s) form(s) the second part. To this end, the passive die may comprise one or more auxiliary bondpads, wherein the third bondwire(s) that belong(s) to the first part extend(s) between the first terminal and the auxiliary bondpad(s), and wherein the third bondwire(s) that belong(s) to the second part extend(s) between the auxiliary bondpad(s) and the third terminal. The auxiliary bondpad(s) can be arranged in between the first terminal and the output lead.

The third bondwires can be arranged in parallel to the one or more first bondwires. Alternatively, the third bondwire(s) belonging to the first part can be arranged at a first angle +α with respect to the one or more first bondwires and the third bondwire(s) belonging to the second part can be arranged at a second angle -β with respect to the one or more first bondwires, wherein α and β are each positive numbers, preferably in a range between 20 and 70 degrees.

The first terminal may be connected to a first bondpad assembly for mounting the one or more second bondwires and the third bondwires belong to the first part, and the third terminal may comprise a second bondpad assembly for mounting the one or more third bondwires belonging to the second part. The first bondpad assembly may be arranged in between the output pad and the second bondpad assembly. The second bondpad assembly may be arranged in between the first bondpad assembly and the one or more auxiliary bondpads.

When the third inductor extends substantially perpendicular to the first direction, the third inductor may comprise one or more third bondwires, wherein the first terminal comprises a first bondpad assembly for mounting the one or more second bondwires and the one or more third bondwires, and wherein the third terminal comprises a second bondpad assembly for mounting the one or more third bondwires, wherein the first bondpad assembly and the second bondpad assembly are spaced apart in a direction perpendicular to the first direction. By arranging the first and second bondpad assemblies in this manner, a perpendicular arrangement of the third inductor relative to the first inductor can be realized. Alternatively, the third inductor may comprise an integrated inductor arranged on the passive die, wherein the third inductor preferably comprises at least one of a transmission line and a spiral inductor.

The passive die may further comprise a third capacitor having a fifth terminal and a grounded sixth terminal. The output network may further comprise a fourth inductor comprising one or more fourth bondwires connected in between the fifth terminal and the output lead. The series connection of the third capacitor and the fourth inductor can be used as part of an impedance matching network.

The passive die may comprise a semiconductor die. For example, the passive die may comprise a Silicon substrate having a resistivity in the range of 1-100 mOhm•cm. In this case, the ground connection can be realized through the substrate itself. The first capacitor may comprise a metal-insulator-metal capacitor, the second capacitor a deep trench capacitor, and/or the third capacitor a metal-insulator-metal capacitor, a fringe capacitor, or a bondpad. Other types of capacitors are not excluded.

The packaged RF power amplifier may comprise a plurality of the active dies and a corresponding plurality of the output networks, each arranged inside the package, wherein each active die is coupled to a respective output network. The component values for the first capacitor, second capacitor, and/or third capacitor, as well as the first inductor, second inductor, and/or third conductor may vary between the output networks.

Additionally or alternatively, the active die may comprise a plurality of RF power transistors, wherein the packaged RF power amplifier further comprises a corresponding plurality of the output networks, wherein each RF power transistor is coupled to a respective output network.

The use of a plurality of active dies and/or multiple RF transistors on a single active die enables the manufacturing of Doherty amplifiers, wherein the main amplifying stage and one or more peaking amplifying stages are integrated in a single package. In this case, the output networks may form part of the Doherty combiner for combining the signals from the main and peaking stages.

The active die may be a Silicon die and the RF power transistor may comprise a laterally diffused metal oxide semiconductor (LDMOS) transistor, and/or the active die may comprise a Gallium Nitride epitaxial layer grown on a substrate and the RF power transistor may comprise a high electron mobility transistor (HEMT), and/or the passive die may comprise a Silicon die.

According to a further aspect, the present invention also relates to a cellular base station that comprises the packaged power amplifier as defined above.

BRIEF DESCRIPTION OF THE FIGURES

Next, the present invention will be described in more detail referring to the appended drawings, wherein identical reference signs are used to indicate identical or similar components, and wherein.

DETAILED DESCRIPTION

Figure 1:
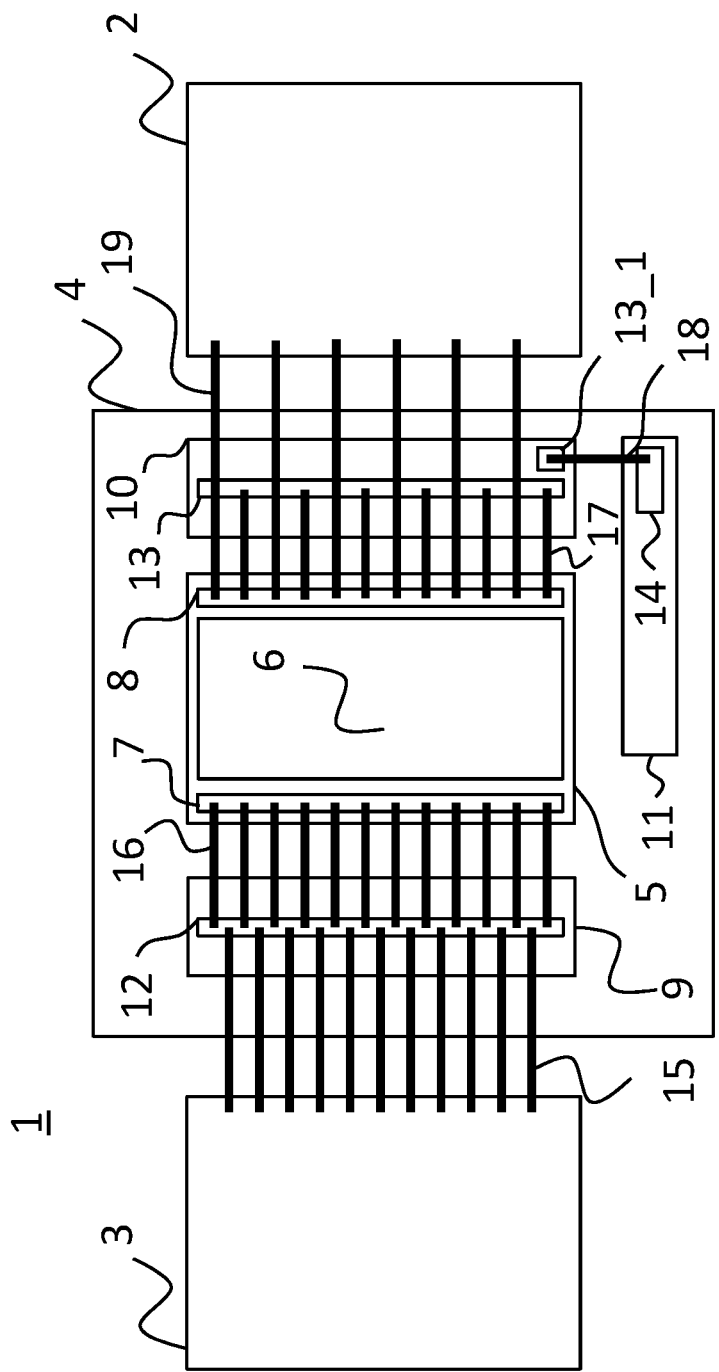
FIG. 1 illustrates a known packaged RF power amplifier.
Figure 3:
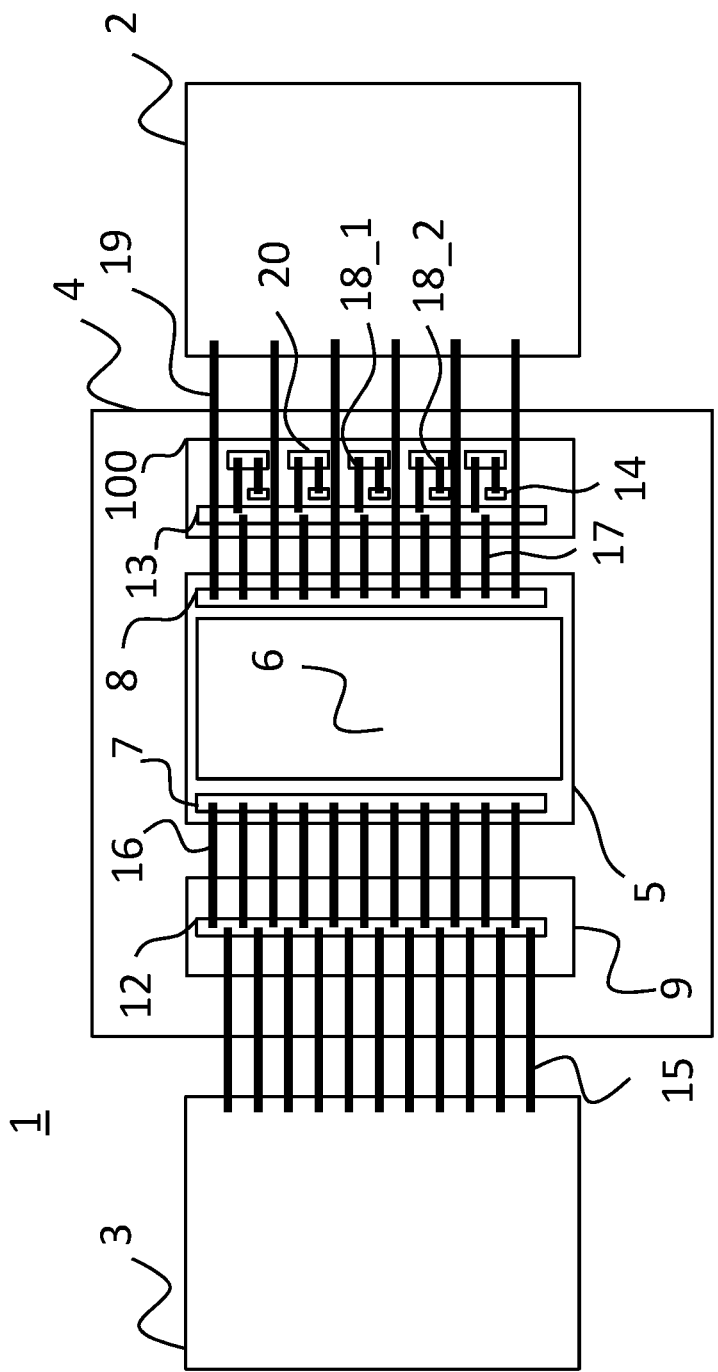
FIG. 3 illustrates an embodiment of a packaged RF power amplifier according to the invention.
Figure 4:
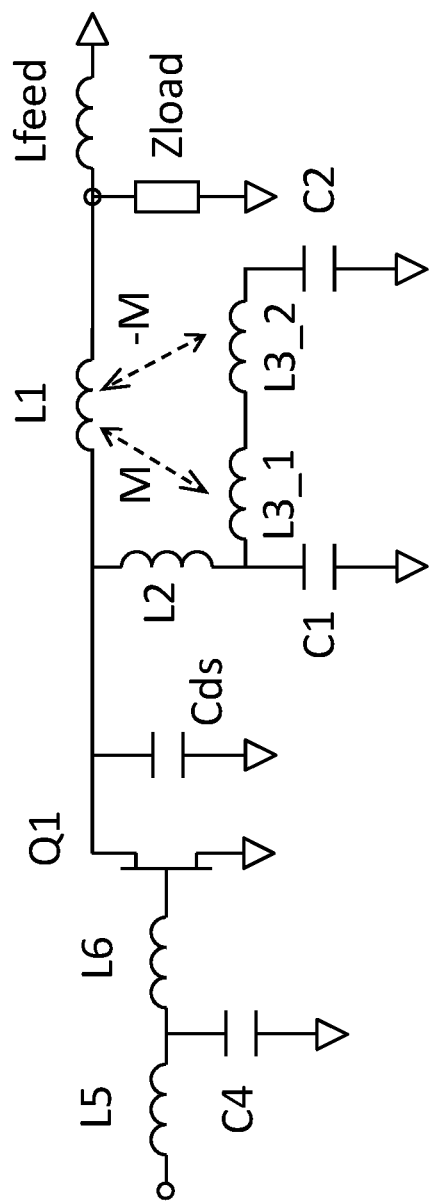
FIG. 4 illustrates the equivalent circuit diagram corresponding to the amplifier of FIG. 3.

The embodiment of the packaged RF power amplifier illustrated in FIG. 3, and for which the equivalent circuit diagram is depicted in FIG. 4, differs from the amplifier in FIG. 1 in that second capacitor C2 is integrated on the same single passive die 100 as first capacitor C1. To this end, the non-grounded terminal of C2 is electrically connected to a plurality of bondpads 14, which are electrically connected and together form a second bondpad assembly. A first part of third inductor L3, i.e. L3_1, is formed by bondwires 18_1 that extend between bondpad bar 13 and auxiliary bondpads 20. A second part of third inductor L3, i.e. L3_2, is formed by bondwires 18_2 that extend between auxiliary bondpads 20 and bondpad assembly 14.

Now referring to FIG. 4, the first part of inductor L3, i.e. L3_1, has a positive coefficient of mutual inductance M with respect to first inductor L1, whereas the second part of inductor L3, i.e. L3_2, has a negative coefficient of mutual inductance. The sign of the mutual inductance can be reversed, depending on the shape and orientation of L3 and/or depending on the sign convention used, but in any case, the polarity of the mutual inductance will between the first and second parts.

Figure 2:
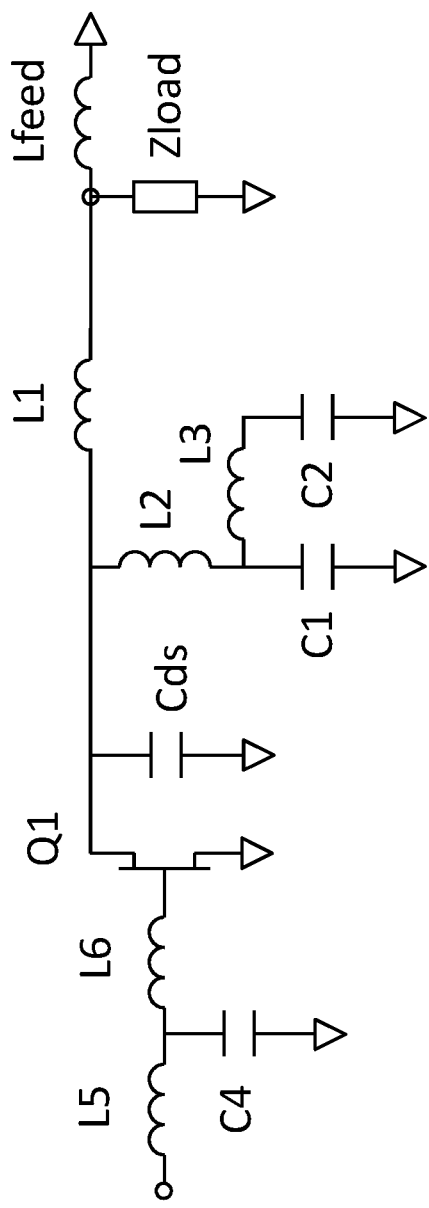
FIG. 2 illustrates the equivalent circuit diagram corresponding to the amplifier of FIG. 1.

Due to the opposite polarities of the mutual inductance M, little to no mutual inductance will exist between the first inductor and the third inductor. The applicant has found that this particular arrangement prevents degradation of RF performance. Without being bound by theory, it is stipulated that a dominant cause of performance degradation when using the general circuit topology of FIG. 2, in combination with the integration of the first and second capacitors on a single die, is related to inductive coupling between the first inductor L1 and third inductor L3.

Figure 5:
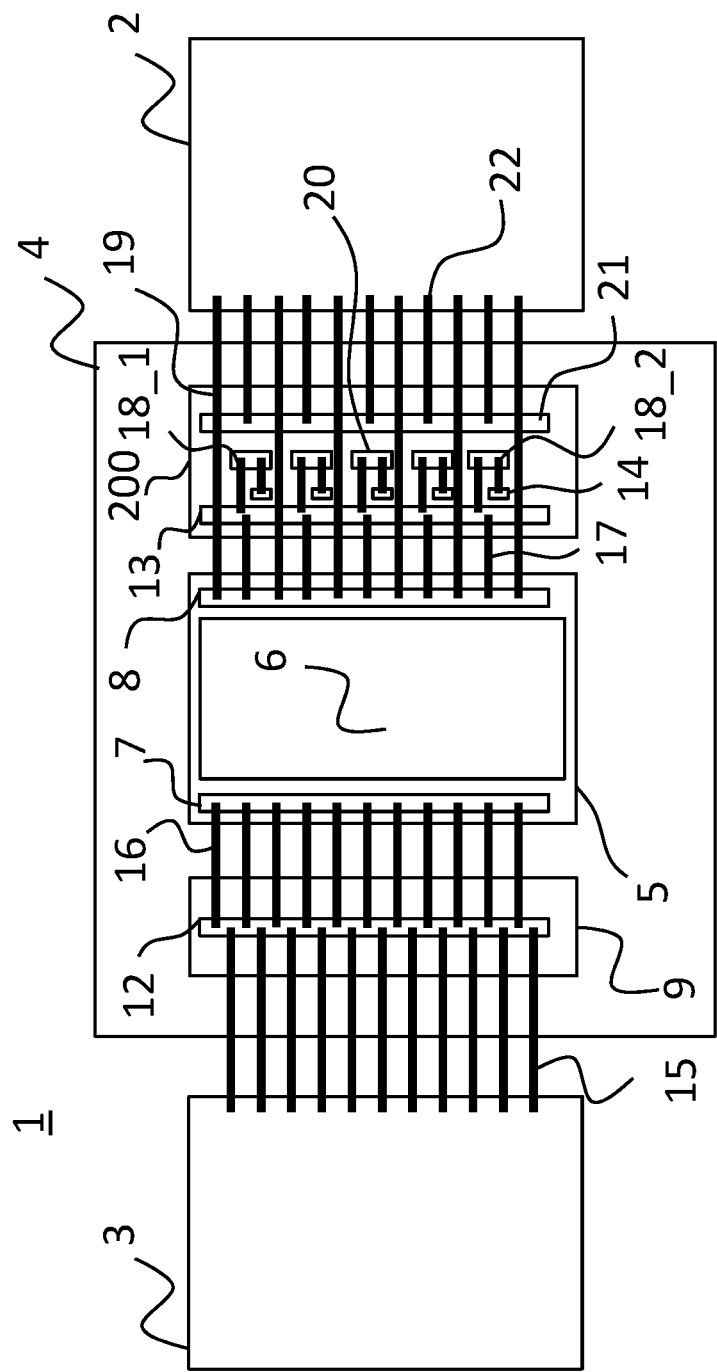
FIG. 5 illustrates a further embodiment of a packaged RF power amplifier according to the invention.
Figure 6:
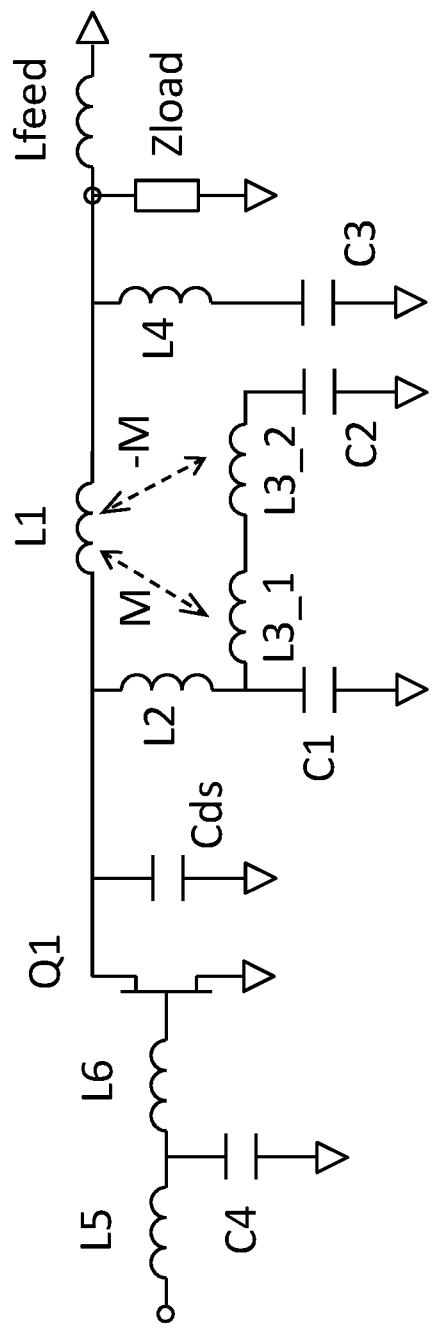
FIG. 6 illustrates the equivalent circuit diagram corresponding to the amplifier of FIG. 5.

FIG. 5 illustrates another embodiment of a packaged RF power amplifier, of which the equivalent circuit diagram is depicted in FIG. 6. This embodiment differs from the FIG. 3 embodiment in that passive die 200, when compare to passive die 100 in FIG. 3, further comprises a third capacitor C3. This capacitor has a grounded terminal and a non-grounded terminal. This latter terminal is electrically connected to a bondpad bar 21. From bondpad bar 21, a plurality of fourth bondwires 22, forming a fourth inductor L4, extend to output lead 2. The series combination of C3 and L4 constitutes an in-package matching network that is configured to provide an impedance matching at the operational frequency of the packaged RF amplifier.

Figure 7:
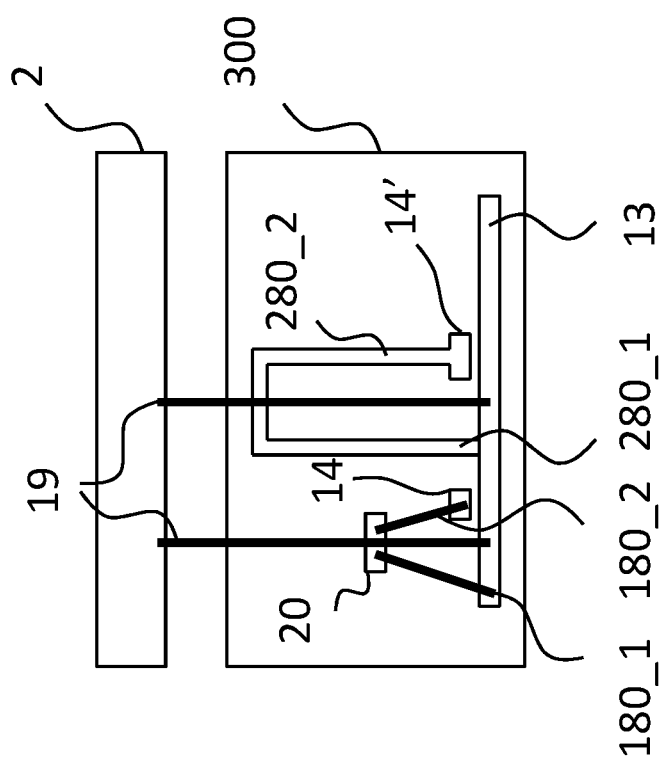
FIG. 7 illustrates alternative configurations for the third conductor of the amplifier of FIGS. 3 and 5.

FIG. 7 illustrates further alternative configurations for the third conductor of the packaged RF power amplifier of FIGS. 3 and 5. In a first configuration, a first part of third inductor 3, i.e. L3_1, is formed by one or more bondwires 180_1 that extend from bondpad bar 13 to auxiliary bondpad 20 under an angle +α with respect of first bondwires 19. The second part of the third inductor 3, i.e. L3_2, is formed by one or more bondwires 180_2 that extend from auxiliary bondpad 20 to second bondpad assembly 14 under an angle −β with respect of first bondwires 19. In an embodiment, angle α is substantially equal to angle β. Exemplary angles for angle α and β lie within the range of 20-70 degrees.

FIG. 7 illustrates a further embodiment for third inductor L3 in which a first piece 280_1 and a second piece 280_2 of transmission line is used for connecting bondpad bar 13 to a connection 14' of the third terminal of second capacitor C2. Although a substantially straight transmission line is illustrated in FIG. 7, the present invention does not exclude other shapes such as a meandering line.

For each configuration of third inductor L3, a first and second part can be identified for which the coefficient of mutual induction is opposite in sign yielding the abovementioned advantage of preventing RF performance degradation.

Figure 8:
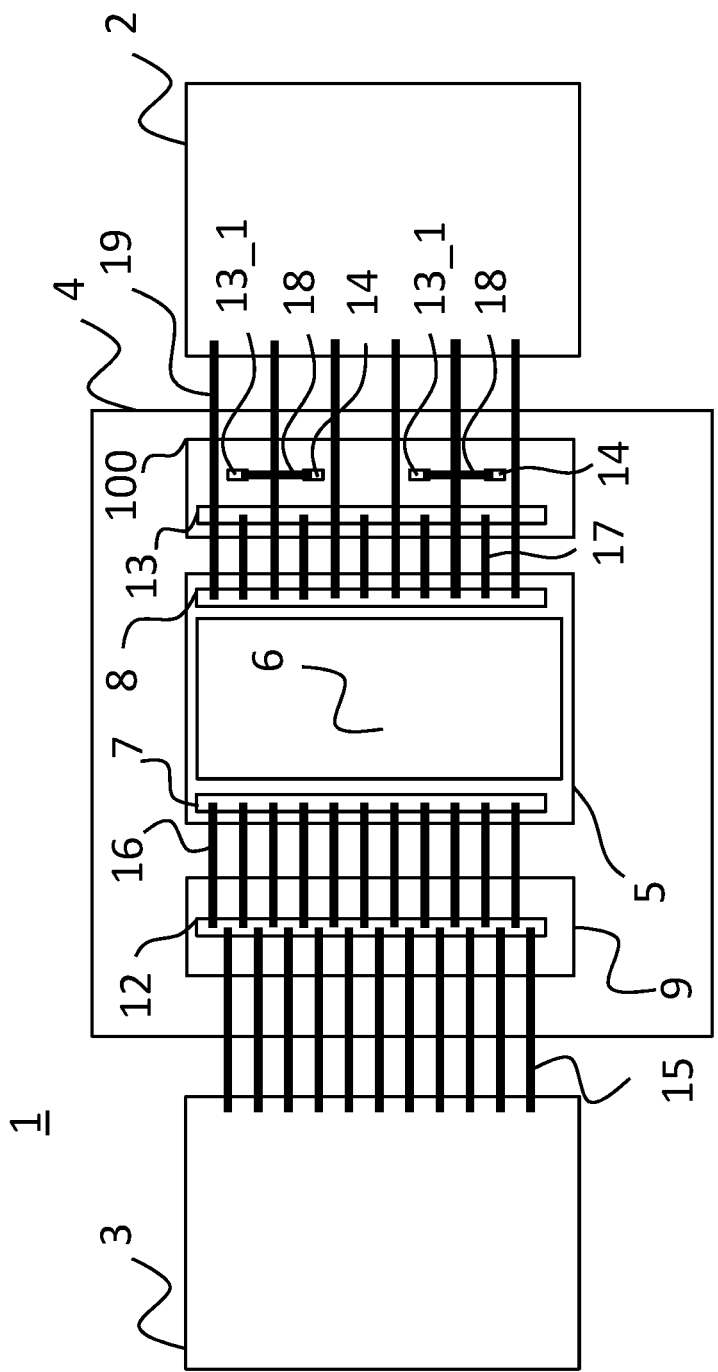
FIG. 8 illustrates a further alternative configuration for the third conductor of the amplifier of FIGS. 3 and 5.

FIG. 8 illustrates a further embodiment for third inductor L3. In this embodiment, inductor L3 is formed using one or more bondwires 18. These bondwires extend between a bondpad 13_1, which is electrically connected to bondpad 13, and a bondpad 14 that is associated with the non-grounded terminal of C2. Although FIG. 8 illustrates two bondwires 18 that each extend between a respective pair of bondpads 13_1, 14, the invention is not limited thereto. For example, multiple bondwires 18 arranged in parallel may extend between one or more pairs of bondpads 13_1, 14.

Bondwires 18 extend perpendicular to bondwires 19. Consequently, there will be little to no electromagnetic coupling between L1 and L3. Bondwires 18 may be configured to cross over or under bondwires 19. Although FIG. 8 illustrates that each bondwire 18 crosses only a single bondwire 19, the invention is not limited thereto. For example, each bondwire 18 may cross a plurality of adjacently arranged bondwires 19. It should be noted that the arrangement of bondwires 18 in FIG. 8 can equally be applied in the embodiment depicted in FIG. 5.

Although the present invention has been described using detailed embodiments thereof, it should be appreciated by the skilled person these embodiments may be modified without departing from the scope of the invention, which is defined by the appended claims and its equivalents.

The invention claimed is:

1. A packaged radiofrequency (RF) power amplifier, comprising:
   a package having an output lead;
   an active die arranged inside the package and on which a RF power transistor is arranged, the RF power transistor having an output and an associated output capacitance;
   a passive semiconductor die arranged in between the output lead and the active die;
   an output network arranged inside the package and comprising:
      a first capacitor having a first capacitance and being provided with a first terminal and a grounded second terminal, the first capacitor being integrated on the passive semiconductor die;
      a second capacitor having a second capacitance and being provided with a third terminal and a grounded fourth terminal, wherein the second capacitance is substantially larger than the first capacitance;
      a first inductor comprising one or more first bondwires extending in a first direction from the output of the RF power transistor to the output lead;
      a second inductor comprising one or more second bondwires extending from the output of the RF power transistor to the first terminal;
      a third inductor connected in between the first terminal and the third terminal;
   wherein a network formed by the second inductor, the third inductor, the first capacitor, and the second capacitor is configured to resonate with the associated output capacitance at or close to an operational frequency of the RF power amplifier;

wherein the second capacitor is integrated on the passive semiconductor die, and wherein the third inductor comprises a first part and a second part connected in series, wherein the first part extends at least partially along the first direction, and wherein the second part extends at least partially in a direction opposite to the first direction;

wherein the third inductor comprises an even number of third bondwires, wherein one half of the third bondwires form the first part and wherein another half of the third bondwires form the second part;

wherein the passive semiconductor die comprises one or more auxiliary bondpads, wherein the third bondwires that belong to the first part extend between the first terminal and the one or more auxiliary bondpads, and wherein the third bondwires that belong to the second part extend between the one or more auxiliary bondpads and the third terminal;

wherein the one or more auxiliary bondpads are arranged in between the first terminal and the output lead; and wherein the first terminal comprises a first bondpad assembly for mounting the one or more second bondwires and the third bondwires belonging to the first part, and wherein the third terminal comprises a second bondpad assembly for mounting the one or more third bondwires belonging to the second part, wherein the first bondpad assembly is arranged in between the output of the RF power transistor and the second bondpad assembly, and wherein the second bondpad assembly is arranged in between the first bondpad assembly and the one or more auxiliary bondpads.

2. The packaged RF power amplifier according to claim 1, wherein the first part and the second part of the third inductor each extend entirely on or above the passive semiconductor die.

3. The packaged RF power amplifier according to claim 1, wherein the first capacitor comprises a metal-insulator-metal capacitor and the second capacitor comprises a deep trench capacitor.

4. The packaged RF power amplifier according to claim 1, wherein the third bondwires are arranged in parallel to the one or more first bondwires.

5. The packaged RF power amplifier according to claim 1, wherein the third bondwires belonging to the first part are arranged at a first angle $+\alpha$ with respect to the one or more first bondwires and wherein the third bondwires belonging to the second part are arranged at a second angle $-\beta$ with respect to the one or more first bondwires, wherein $\alpha$ and $\beta$ are each positive numbers, preferably in a range between 20 and 70 degrees.

6. The packaged RF power amplifier according to claim 1, wherein the passive die comprises a third capacitor having a fifth terminal and a grounded sixth terminal, the output network further comprising a fourth inductor comprising one or more fourth bondwires connected in between the fifth terminal and the output lead, wherein the third capacitor comprises a metal-insulator-metal capacitor, or a fringe capacitor.

7. The packaged RF power amplifier according to claim 1, comprising a plurality of the active dies and a corresponding plurality of the output networks, each arranged inside the package, wherein each active die is coupled to a respective output network.

8. The packaged RF power amplifier according to claim 1, wherein the active die comprises a plurality of RF power transistors, the packaged RF power amplifier further comprising a corresponding plurality of the output networks, wherein each RF power transistor is coupled to a respective output network.

9. The packaged RF power amplifier according to claim 1, wherein:
the active die is a Silicon die and the RF power transistor comprises a laterally diffused metal oxide semiconductor (LDMOS) transistor;
the active die comprises a Gallium Nitride epitaxial layer grown on a substrate and the RF power transistor comprises a high electron mobility transistor (HEMT); and
the passive die comprises a Silicon die.

10. A cellular base station comprising the packaged power amplifier as defined in claim 1.

* * * * *